United States Patent
Quinton et al.

(10) Patent No.: US 9,564,884 B1
(45) Date of Patent: Feb. 7, 2017

(54) CIRCUITRY AND METHOD FOR MEASURING NEGATIVE BIAS TEMPERATURE INSTABILITY (NBTI) AND HOT CARRIER INJECTION (HCI) AGING EFFECTS USING EDGE SENSITIVE SAMPLING

(71) Applicant: Abreezio, LLC, Sunnyvale, CA (US)

(72) Inventors: Bradley Quinton, Vancouver (CA); Trent McClements, Burnaby (CA); Andrew Hughes, Vancouver (CA); Sanjiv Taneja, Cupertino, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/791,444

(22) Filed: Jul. 4, 2015

Related U.S. Application Data

(60) Provisional application No. 62/146,412, filed on Apr. 13, 2015.

(51) Int. Cl.
  *G06F 1/10* (2006.01)
  *H03K 5/13* (2014.01)
  *H03K 5/00* (2006.01)

(52) U.S. Cl.
  CPC ....... *H03K 5/13* (2013.01); *H03K 2005/00019* (2013.01)

(58) Field of Classification Search
  USPC ........ 327/530, 538, 540, 545; 716/406, 408, 716/112–113
  See application file for complete search history.

(56) References Cited

U.S. PATENT DOCUMENTS

| | | | | |
|---|---|---|---|---|
| 8,497,694 B2* | 7/2013 | Chua-Eoan | ............ | G01R 29/26 324/750.15 |
| 8,745,561 B1 | 6/2014 | Garg et al. | | |
| 8,769,470 B2 | 7/2014 | Dai et al. | | |
| 8,860,502 B2* | 10/2014 | Gemmeke | ............... | G06F 1/324 327/113 |
| 2009/0031268 A1* | 1/2009 | Miranda | ............. | G06F 17/5031 716/113 |
| 2011/0055781 A1 | 3/2011 | Potkonjak | | |

\* cited by examiner

*Primary Examiner* — An Luu
(74) *Attorney, Agent, or Firm* — Smith Tempel Blaha LLC

(57) ABSTRACT

Toggling functional critical path timing sensors measure delays in toggling functional critical paths that continuously receive patterns from an aging pattern generator. Wear is accelerated. A margin delay adjustment controller sweeps margin delays until failures occur to measure delays. The margin delay is then adjusted in functional critical path timing sensors that add the margin delay to functional critical paths that carry user data or chip controls during normal operation. When the path delays fail to meet requirements, the functional critical path timing sensors signal a controller to increase VDD. When no failures occur over a period of time, the controller decreases VDD. Wear on the toggling functional critical paths is accelerated using both toggle and low-transition-density patterns. Circuit aging is compensated for by increasing margin delays to timing sensors.

20 Claims, 11 Drawing Sheets

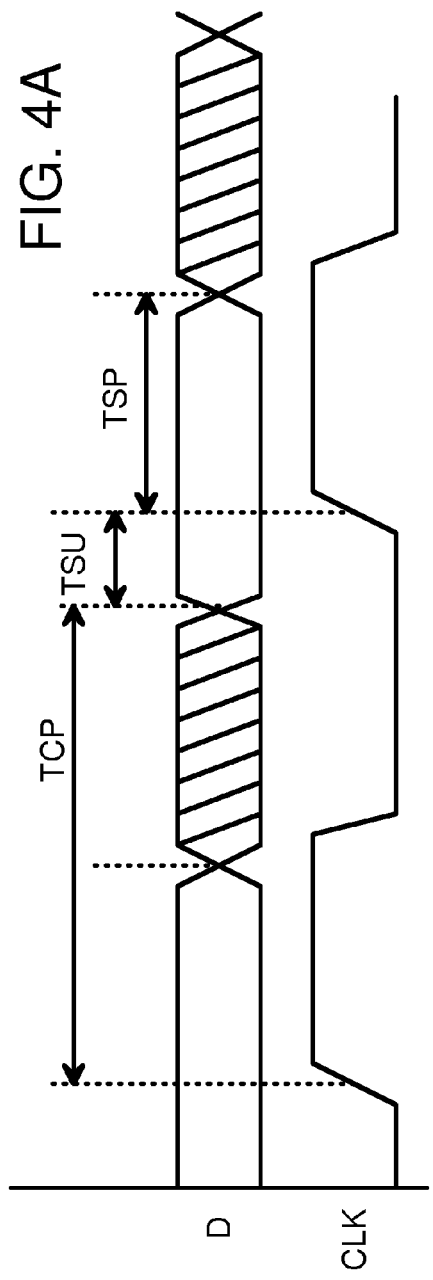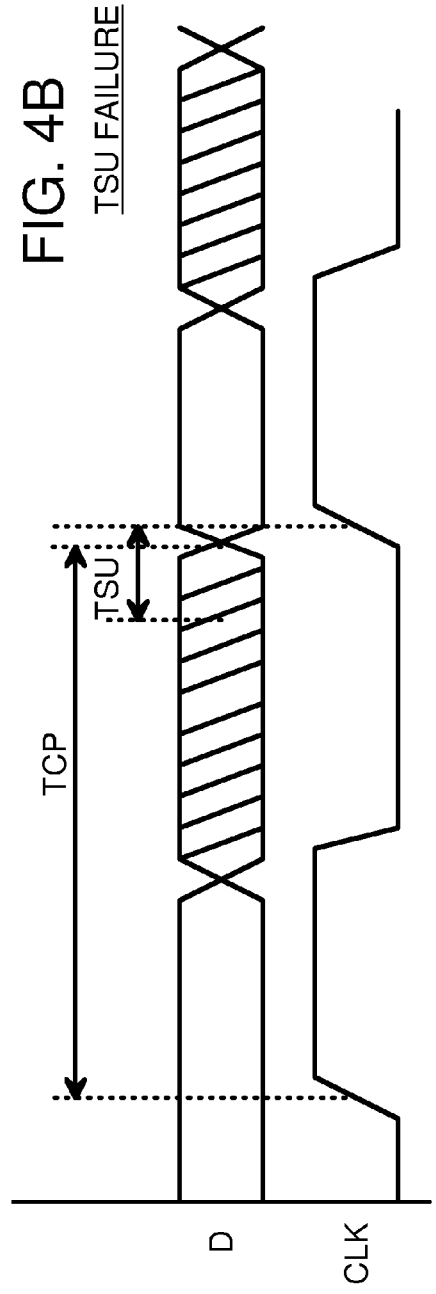

CIRCUITRY AND METHOD FOR MEASURING NEGATIVE BIAS TEMPERATURE INSTABILITY (NBTI) AND HOT CARRIER INJECTION (HCI) AGING EFFECTS USING EDGE SENSITIVE SAMPLING

RELATED APPLICATION

This application is a non-provisional of the provisional application for "Circuitry and Method for Critical Path Timing Speculation using Edge Sensitive Sampling". U.S. Ser. No. 62/146,412, filed Apr. 13, 2015.

FIELD OF THE INVENTION

This invention relates to on-chip aging compensation, and more particularly to accelerating wear of critical paths and using sensed delays to adjust other sensors in a chip.

BACKGROUND OF THE INVENTION

While Integrated Circuit (IC) semiconductor devices are much more stable over time compared with older technologies, signs of wear or aging can occur, and IC's can have a finite lifetime. As device sizes shrink, aging effects may become more pronounced. For example, some newer flash memories may spec a reduced number of lifetime read/write cycles.

Hot Carrier Injection (HCI) occurs when electrons are accelerated by a high electric field, such as near the drain of a Metal-Oxide-Semiconductor Field-Effect Transistor (MOSFET) transistor. These "hot" electrons can damage the gate oxide, resulting in trapped charges. As more charges are trapped over the lifetime of a chip, the transistor threshold voltages may increase, reducing the transistor's current drive and speed.

Other aging mechanisms may occur for more advanced IC processes. Negative Bias Temperature Instability (NBTI) is thought to occur when nitrides are added to gate oxides, especially at the silicon-oxide interface. NBTI may have a greater impact on p-channel transistors than on n-channel transistors, resulting in circuit skews. Other mechanisms that cause circuit wear may also exist or are yet to be discovered and understood.

Semiconductor devices are specified (spec'ed) to operate within certain parameters, such as a maximum power draw and a maximum clock frequency. While semiconductor manufacturing processes are very precise, process variations do occur. Although the manufacturing process may target a typical device, sometimes process variations produce slower chips or faster chips. As device sizes shrink, larger relative variations may occur.

Chips may be tested to determine their power draw and speed, and these chips may be sorted into slow-chip bins, fast-chip bins, and typical-chip bins. The faster chips may be sold as faster speed grades, while the slower chips may be sold for slower speed grades. Unfortunately, such process skews are not always reproducible or planned but may occur randomly, making for logistical difficulties. Therefore all process skews are often lumped together. The slowest expected process skews determine the specified speed of the device, while the fastest expected process skews determine the specified maximum power dissipation.

FIG. 1 is a graph showing how process variations affect device specifications. The slowest process skew (SS) has the lowest power and the lowest performance or speed. A typical process (TT) has a better power and performance product. The fastest process skew (FF) has the highest performance and speed, but also consumes the most power.

All three process skews—slow, typical, and fast, share the same device specifications when no grade sorting is performed. Devices produced with the slowest process determine the speed specs such as the maximum clock frequency, or the minimum clock-to-output delay times. However, the fast devices consume more power than do the slower devices, so power specs are determined by devices manufactured by the fast process skews. The power-supply voltage VDD is usually fixed.

The performance and power specs are determined by the worst-case devices over the expected process skews. Slow devices set the speed specs and fast devices set the power specs. This is not optimal, since fast devices are spec'ed slower than they can actually operate, and slow devices actually draw less power than spec'ed.

Also, as the devices age, wear occurs, such as by HCI or NBTI. This wear may be caused by trapped electrons or other ions that gradually increase threshold voltages and thus reduce current drive. As thresholds gradually rise over the life of the chip, the chip's performance worsens. The manufacturer may have to add a margin of safety to the chip's spec's to account for future aging effects.

Specialized sensors may be added to chips to facilitate at-speed testing. Dummy bit lines have been added to RAM arrays to adjust bit-line sensing circuits. An oscillator or a canary circuit may be added to track process variations. However, the actual circuit may be much more complex than an oscillator, resulting in tracking errors. For logic chips, a dummy path and an on-chip timing sensor may be added. The timing sensor can report its results to a tester or even to an on-chip controller that can adjust operating conditions, such as to slow down or stop a clock to reduce power consumption.

While such on-chip dummy paths and sensors are useful, it is desired to measure the actual critical paths rather than measure a dummy path. It is desired to add a timing sensor to an actual critical path on a chip so that the timing sensor is measuring the delay of the same physical path that carries functional data during operation of the chip.

It is further desired to account for wear and aging of the chip. It is desired to accelerate aging on a dummy path, and then to measure the amount of wear and adjust other on-chip sensors to account for the measured wear. It is desired to accelerate wear on a dummy sacrificial path, and then use the measured wear to adjust margins for timing sensors on actual critical paths. Thus the actual critical paths do not experience accelerated wear, but are adjusted for the accelerated wear on a dummy path.

BRIEF DESCRIPTION OF THE DRAWINGS

FIGS. 4A-B are timing diagrams showing critical-path timing success and failure.

DETAILED DESCRIPTION

The present invention relates to an improvement in wear sensors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that test data patterns that accelerate wear can be applied to a dummy path, and the slowing of that dummy path over its lifetime can be measured. The measured wear can then be used to adjust added timing margins in other sensors on the chip. The added timing margin accounts for the actual wear measured.

For the other timing sensors, actual functional critical paths are measured rather than a dummy path. Tracking errors are eliminated. The sensor results may be used to speed up or slow down the chip by adjusting power-supply voltage VDD. Process skews cause timing variations in the functional critical paths which are measured by the sensors and then compensated for by adjusting VDD. Aging is measured on the dummy paths and then accounted for by increasing the margin delays in the functional critical path timing sensors.

Figure 2:
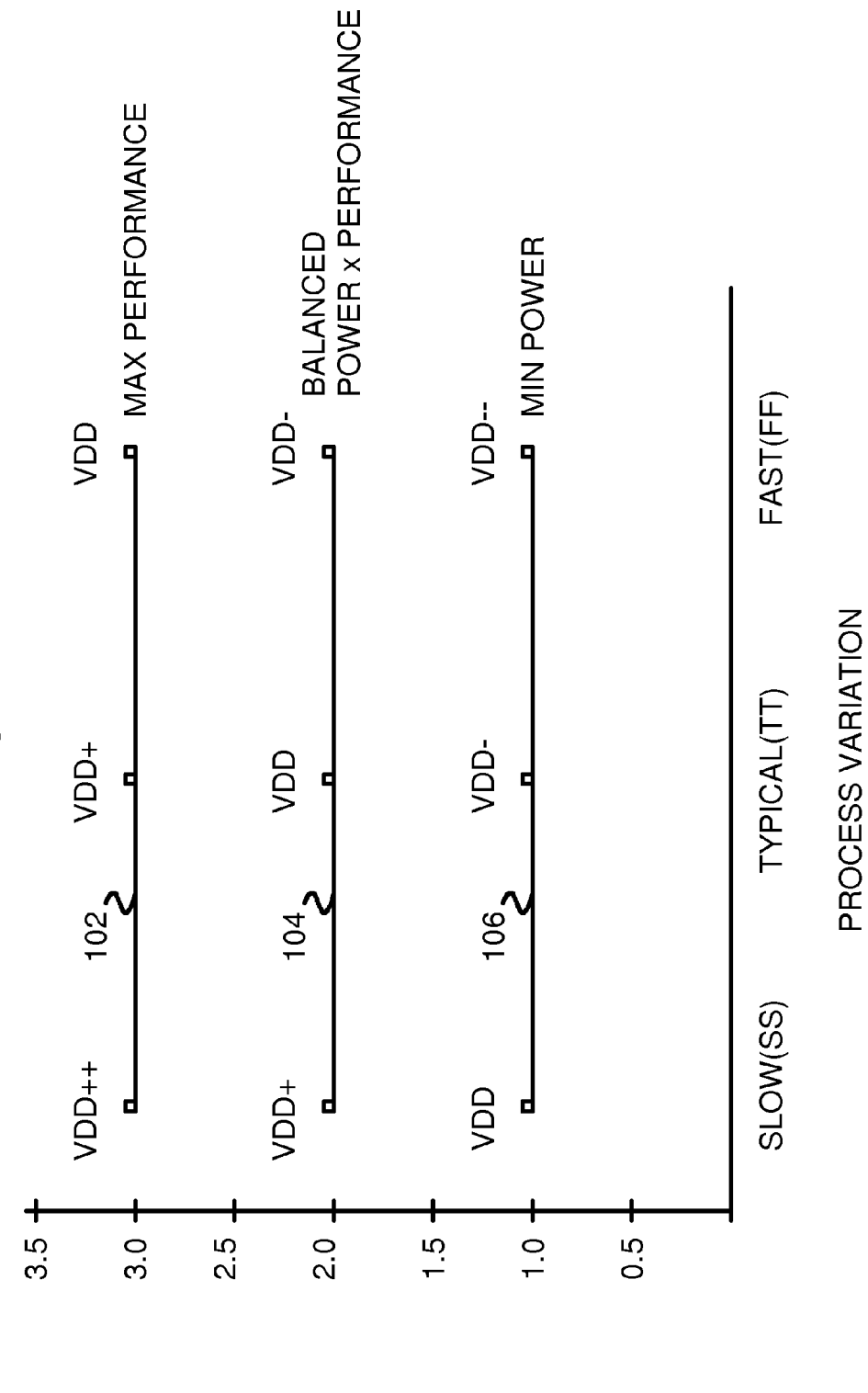
FIG. 2 is a graph showing adjusting VDD to compensate for process skews.

FIG. 2 is a graph showing adjusting VDD to compensate for process skews. On-chip sensors accurately measure timing delays in functional critical paths. Since the actual critical-path delays are precisely measured, less of a guard band is needed in the chip specifications. Process skews are accurately accounted for, so either the performance or the power spec may be increased. Since wear over the chip's lifetime is also measured and accounted for by adjusting margin delays of the other sensors, less of a guard band is needed when the manufacturer specs the chip.

When lifetime performance is maximized, curve 102 shows that the fast process skew chips are powered by VDD and determine the performance specs. The internal power supply to the typical chip is increased to VDD+ to increase its performance to match the performance of the fast-process chip. The internal power supply to the slow-process chip is increased further to VDD++ so the slow-process chip can also meet the timing spec of the fast-process chip. Since the maximum power consumption spec is determined by the fast-process chip operating at VDD (See FIG. 1), the typical and slow chips will consume less than the spec'ed power when powered at VDD. The amount of increase in VDD to VDD+ and VDD++ can be chosen so that the maximum power spec is not exceeded. Thus the slow and typical chips still consume less than the spec'ed power but also have increased performance using curve 102.

Figure 1:
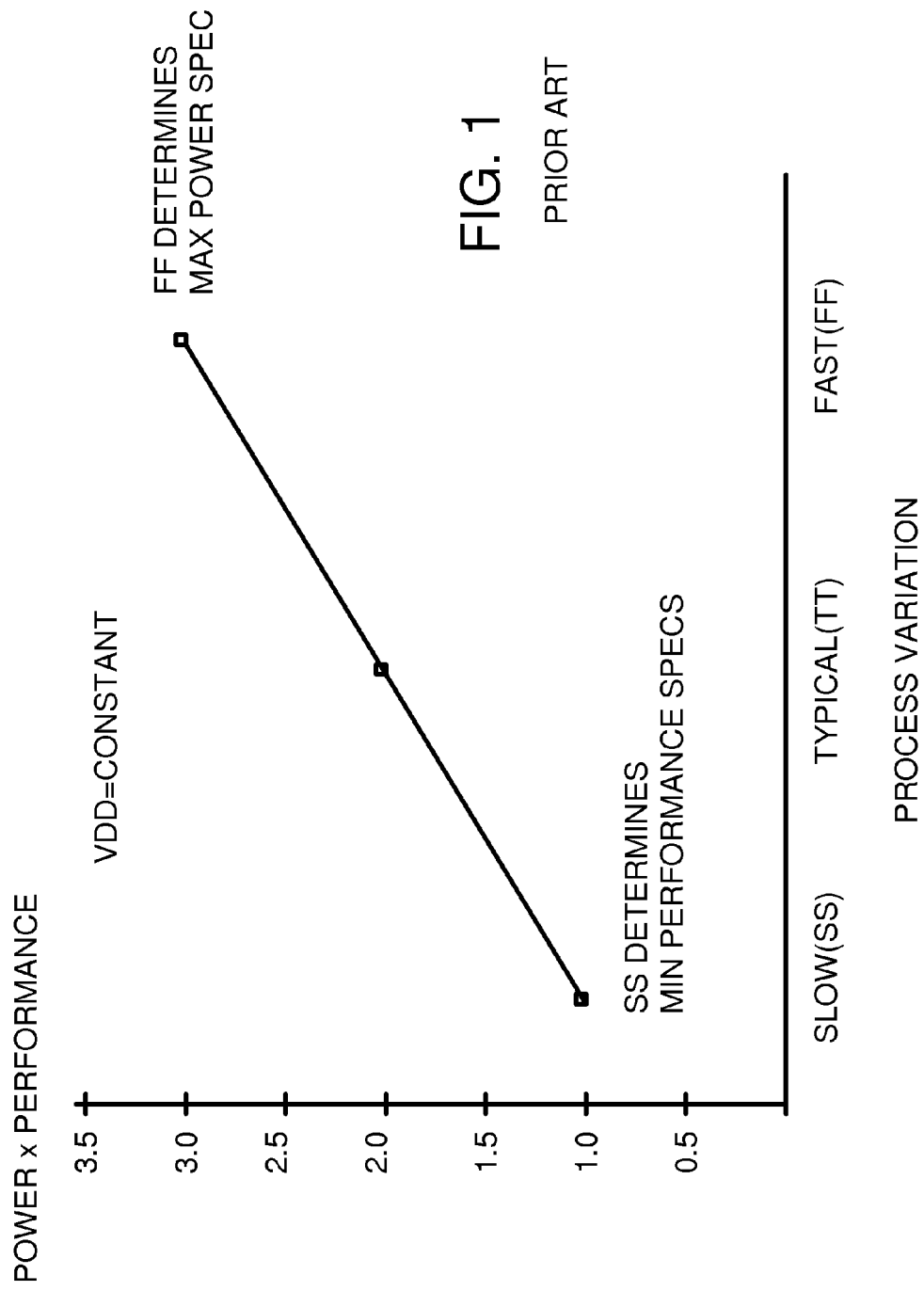
FIG. 1 is a graph showing how process variations affect device specifications.

When reducing power is more important than increasing performance, such as for battery-powered applications, curve 106 is used. The slow-process chip is powered by VDD and sets the performance specs (FIG. 1). However, since the typical and fast-process chips are inherently faster at the same nominal VDD, their internal power supplies are decreased to VDD− and VDD−− so that the same performance spec is reached but power consumption is reduced.

Curve 104 shows a balanced approach. When the internal critical-path sensors determine that the chip was made using a typical process, this typical-process chip is powered with the nominal VDD. Power is less than the maximum spec'ed by the fast-process chips and performance is better than the minimum spec'ed by the slow-process chips.

When the critical-path timing sensors determine that the chip is a fast-process chip, even when the actual wear is accounted for, the internal VDD is reduced to VDD−. This reduces power consumption while maintaining performance. When the critical-path timing sensors determine that the chip is a slow-process chip, the internal VDD is raised to VDD+. This increases performance while maintaining power consumption.

Thus by measuring the timing of actual critical paths, and by adjusting for the actual amount of wear detected, the internal power supply to internal circuits is adjusted up or down to compensate for process skews. The chip may operate at higher performance or power may be saved. Thus chip operation is optimized for the process skew that the chip was manufactured with, and for reduced performance as the chip ages over its lifetime.

Figure 3:
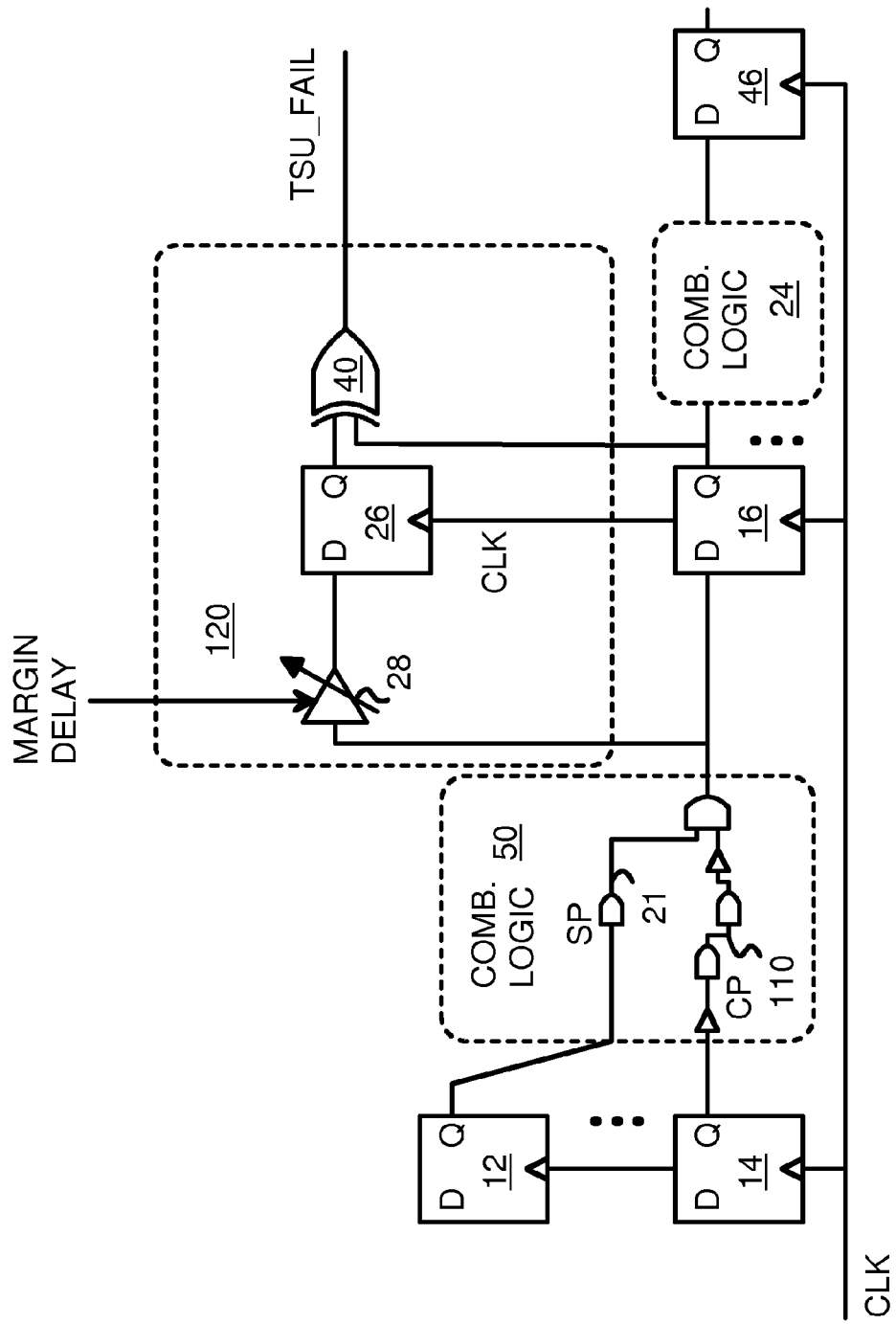
FIG. 3 shows a functional critical path timing sensor with a margin delay to detect failures before they occur.

FIG. 3 shows a functional critical path timing sensor with a margin delay to detect failures before they occur. Critical path 110 is an actual functional critical path, such as a chain of logic gates between two flip-flops within a logic block powered by VDD.

Flip-flops 12, 14, 16, 46 are clocked by CLK and may have data scanned into them during a test mode, such as by using Level-Sensitive Scan Design (LSSD) and similar techniques. Combinatorial logic 50 includes logic gates between first-level flip-flops 12, 14 and next-level flip-flop 16. When the rising edge of CLK occurs, the Q outputs of first-level flip-flops 12, 14 change, and this change propagates through functional critical path 110 and short path 21 within combinatorial logic 50 to the D input of next-level flip-flop 16.

When the set-up time to next-level flip-flop 16 is met, the correct data is clocked into next-level flip-flop 16, and then passes through combinatorial logic 24 to third-level flip-flop 46. An actual circuit has many more flip-flops at each level than shown. During normal operation, data and control signals are clocked through the flip-flops. However, during a test mode the test data is scanned into the flip-flops, which may include muxes on their D inputs and/or a separate test clock.

Once the desired test data is clocked into the flip-flops, CLK is pulsed, allowing the test data from first-level flip-flops 12, 14 to flow through functional critical path 110 and short path 21 to the D input of next-level flip-flop 16. When the set-up timing requirement is met, the correct data is clocked into next-level flip-flop 16 and appears at the Q output.

Test mode is not required for timing measurements. Normal user or other chip data and control information may have a sufficient number of state changes to allow for testing, especially if several different functional critical paths are tested, or if test software selects paths with a higher frequency of state change. However, it is undesirable to have actual failures occur during normal chip operation. A test flip-flop with an added set-up-time delay may be added in parallel to flip-flop 16 to detect errors before they would occur in flip-flop 16.

Such an added timing margin may be included in the critical path sensors. Margin delay buffer 28 receives the D input to next-level flip-flop 16 and adds a margin delay before driving the D input of early capture flip-flop 26. Both next-level flip-flop 16 and early capture flip-flop 26 are clocked by the same CLK, but margin delay buffer 28 increases the effective required set-up time to early capture flip-flop 26. The test data through functional critical path 110 must arrive at least the margin delay of margin delay buffer 28 earlier to avoid a timing failure early capture flip-flop 26. As the delay through functional critical path 110, TCP, is slowly increased, early capture flip-flop 26 will capture a timing failure before next-level flip-flop 16 does. Thus the functional logic is not subjected to a failure that could disrupt operations later.

XOR gate 40 compares the D and Q terminals of early capture flip-flop 26 rather than of next-level flip-flop 16. Thus critical path timing sensor 120 captures an early timing failure before the functional path's flip-flop experiences a timing failure. Timing failures in the functional paths (next-level flip-flop 16) are predicted rather than detected while still using the actual functional critical paths (110) for combinatorial logic. The differences in electrical characteristics between next-level flip-flop 16 and early capture flip-flop 26 are less important since margin delay buffer 28 adds a delay that is likely larger than any differences between flip-flops 16, 26.

When the outputs of next-level flip-flop 16 and early capture flip-flop 26 are not in the same state after clocking, a failure is detected by XOR gate 40 to generate the set-up timing failure signals TSU_FAIL.

Figure 5:
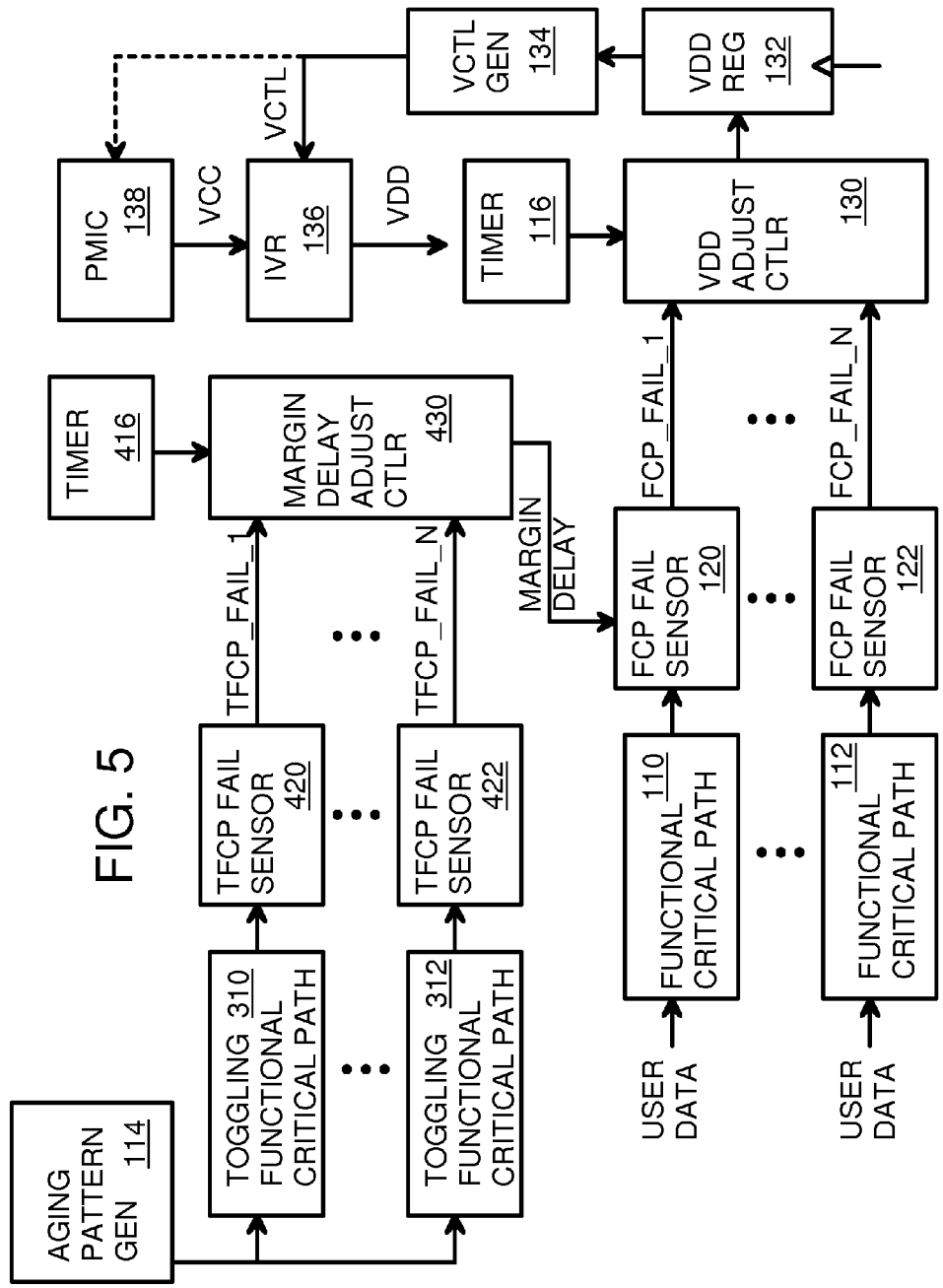
FIG. 5 is a block diagram with a controller that adjusts the internal power supply in response to critical path timing measurements and another controller that adjusts margin delay to account for aging.

XOR gate 40, early capture flip-flop 26, and margin delay buffer 28 form Critical-Path (CP) sensor 120. The delay of margin delay buffer 28 can be varied to account for aging, such as by controller 430 (FIG. 5).

FIGS. 4A-B are timing diagrams showing critical-path timing success and failure. In FIG. 4A, the D input to a D-type flip-flop receives a signal generated by functional critical path 110 of FIG. 3. The flip-flops are clocked by the rising edge of clock CLK. When CLK rises, data from the outputs of upstream flip-flops travel through various paths to the inputs of the next logical level of flip-flops. The changing signals must propagate through the various paths and arrive at the D inputs of the next level of flip-flops at least a set-up time TSU before the next rising edge of CLK. The slowest path is the critical path that has a delay of TCP.

Several other paths may converge with this critical path. The fastest of these converging paths has a shortest path delay of TSP. After each rising clock edge of CLK, the D input to the next level of flip-flop can begin to change TSP after the CLK edge, and may continue to change until TCP. In FIG. 4A, TCP occurs just before the required TSU, so timing does not fail. The correct data is clocked into the next-level flip-flop.

In FIG. 4B, a timing failure occurs. The clock may be running at a higher frequency in FIG. 4B than in FIG. 4A, a lower VDD, a higher temperature, a slower-process chip may be shown, or the chip may have aged or otherwise degraded.

The critical path delay TCP is larger relative to the clock period so that the D input is still changing after TSU. The correct data through the critical path does not arrive at D until after TSU, so the wrong data may get clocked into the next-level flip-flop. A set-up timing error occurs.

FIG. 5 is a block diagram with a controller that adjusts the internal power supply in response to critical path timing measurements and another controller that adjusts margin delay to account for aging.

Aging pattern generator 114 generates test patterns that accelerate wear. High-transition density patterns may be generated with a toggle flip-flop to maximize wear due to HCI, while low-transition-density patterns may be generated by software periodically writing to a register to accelerate static wear such as by NBTI. The aging test patterns are input to toggling functional critical paths 310, . . . 312. Toggling functional critical paths 310, . . . 312 are dummy paths that do not carry user data or chip controls. Thus failure of toggling functional critical paths 310, . . . 312 does not cause chip operation to fail. Toggling functional critical paths 310, . . . 312 can safely be worn at an accelerated rate.

The aging test patterns pass through toggling functional critical paths 310, . . . 312 and are sensed by toggling functional critical path timing sensors 420, . . . 422. Failure signals TFCP_FAIL_1, TFCP_FAIL_2, . . . TFCP_FAIL_N are generated by toggling functional critical path timing sensors 420, . . . 422 when the aging test patterns do not meet the set-up time requirements, such as when toggling functional critical paths 310, . . . 312 have slowed in performance due to aging.

Margin delay adjustment controller 430 measures the timing margins of toggling functional critical paths 310, . . . 312. When no failures are detected within a period of time indicated by timer 416, margin delay adjustment controller 430 adjusts toggling functional critical path timing sensors 420, . . . 422 to use a larger margin delay until failures occur. Then the final margin value before failures occur can be used by critical path timing sensors 120, . . . 122.

Critical path 110 is an actual functional critical path, such as a chain of logic gates between two flip-flops within a logic block powered by VDD. User data, controls, or other information required by normal chip operation is clocked into functional critical paths 110, . . . 112. During a test mode, test data may pass through critical paths 110, . . . 112 to critical path timing sensors 120, 122. Critical path timing sensors 120, 122 determine when the user data or test data did not meet the set-up timing requirement to the next flip-flop, and then activate timing failure signals TSU_FAIL_1, TSU_FAIL_2, . . . TSU_FAIL_N to controller 130. The set-up timing requirements include the margin delay from margin delay adjustment controller 430. For example, margin delay adjustment controller 430 can set or adjust the margin delay of margin delay buffer 28 in critical path timing sensors 120 of FIG. 3.

Controller 130 receives the timing failure signals from critical path timing sensors 120, 122 and signals adjustments for VDD. When one or more valid timing failure signals are received, controller 130 increases VDD by some increment by writing a value into VDD register 132 that causes VDD to increase. When no timing failure signals are received during a period of time set by timer 116, controller 130 may decrease VDD by writing a smaller value to VDD register 132. Controller 130 may use various routines and procedures to test out different VDD voltages and then to back away from a level of VDD that causes failures to provide a guard band.

Power Management Integrated Circuit (PMIC) 138 is an external IC that generates a VCC power supply applied to a chip. Integrated Voltage Regulator (IVR) 136 receives VCC on an external pin and generates a regulated internal power supply voltage VDD. IVR 136 could be a Low-Drop Out (LDO) regulator or a Switching Mode Power Supply (SMPS) regulator that are on the substrate with critical paths 110, . . . 112 and supply VDD to all internal components within the same voltage domain.

The digital value in VDD register 132 is converted to an analog voltage by VCTL control voltage generator 134. This control voltage VCTL is applied to an analog control voltage input to either internal IVR 136 or to external PMIC 138. Control voltage VCTL causes IVR 136 or PMIC 138 to adjust the VDD or VCC generated. Thus controller 130 adjusts VDD in response to timing failure signals from critical path timing sensors 120, 122. The adjusted VDD is applied to all components in the voltage domain, such as functional critical paths 110, 112, critical path timing sensors 120, controller 130, VDD register 132, and VCTL control voltage generator 134. Aging pattern generator 114, toggling functional critical paths 310, . . . 312, toggling functional critical path timing sensors 420, . . . 422, timer 416, and margin delay adjustment controller 430 may also be in the same VDD domain.

Figure 6:
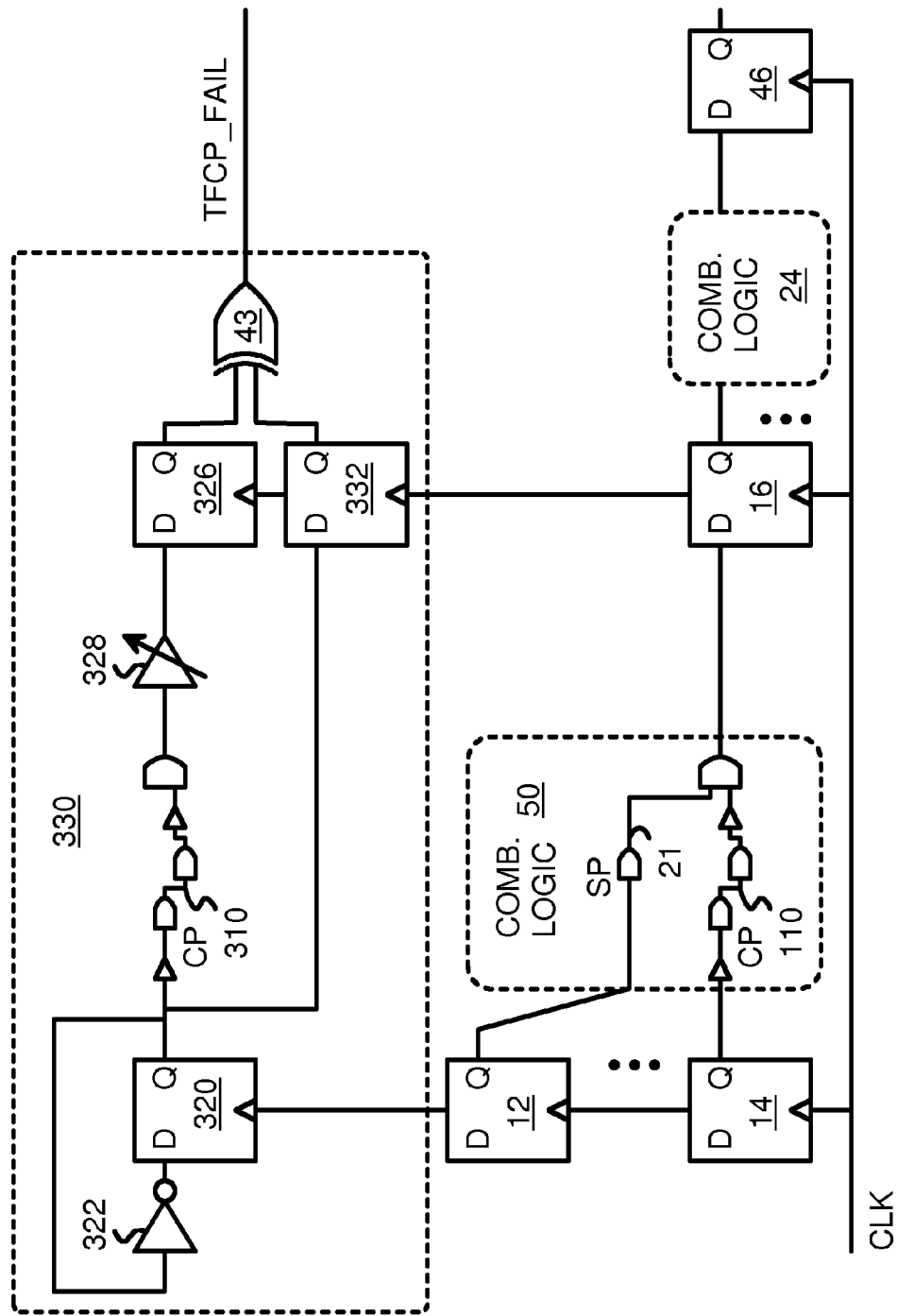
FIG. 6 is a schematic of toggling functional critical paths and their timing sensors.

FIG. 6 is a schematic of toggling functional critical paths and their timing sensors. Aging sensor 330 may be physically located close to combinatorial logic 50 and functional critical path 110, but does not carry user data and is not functionally connected with the user data path.

Aging pattern generator 114 is implemented as a toggle flip-flop to maximize the frequency of state transitions. Inverter 322 inverts the Q output of toggle flip-flop 320 to drive its D input. Since the state of toggle flip-flop 320 is changing at each CLK cycle, the transition density is likely higher than any functional critical path 110 since user data rarely changes each for CLK. Thus transitions and wear are accelerated for toggling functional critical path 310 relative to functional critical path 110.

When the rising edge of CLK occurs, the Q output of toggle flip-flop 320 changes, and this change propagates through toggling functional critical path 310 and margin delay buffer 328 to the D input of margin detect flip-flop 326.

When the set-up time to margin detect flip-flop 326 is met, the correct data is clocked into margin detect flip-flop 326 and appears on its Q output. As the margin delay of margin delay buffer 328 is increased, eventually the set-up time is violated and the wrong data is clocked into margin detect flip-flop 326.

The Q output of toggle flip-flop 320 is applied as a reference signal directly to the D input of reference flip-flop 332. Since there is little delay between toggle flip-flop 320 and reference flip-flop 332, reference flip-flop 332 always contains the correct data.

After the rising edge of CLK, the Q terminals of margin detect flip-flop 326 and reference flip-flop 332 should be identical. However, if the set-up timing failed, the wrong data is clocked into margin detect flip-flop 326, at the Q terminals likely have different data.

XOR gate 43 compares the Q terminals of margin detect flip-flop 326 and reference flip-flop 332 and signals a timing failure when they are different. When the Q terminals are not in the same state, a failure is detected by XOR gate 43, which generates the toggling functional critical path timing failure signal TFCP_FAIL.

Figure 7:
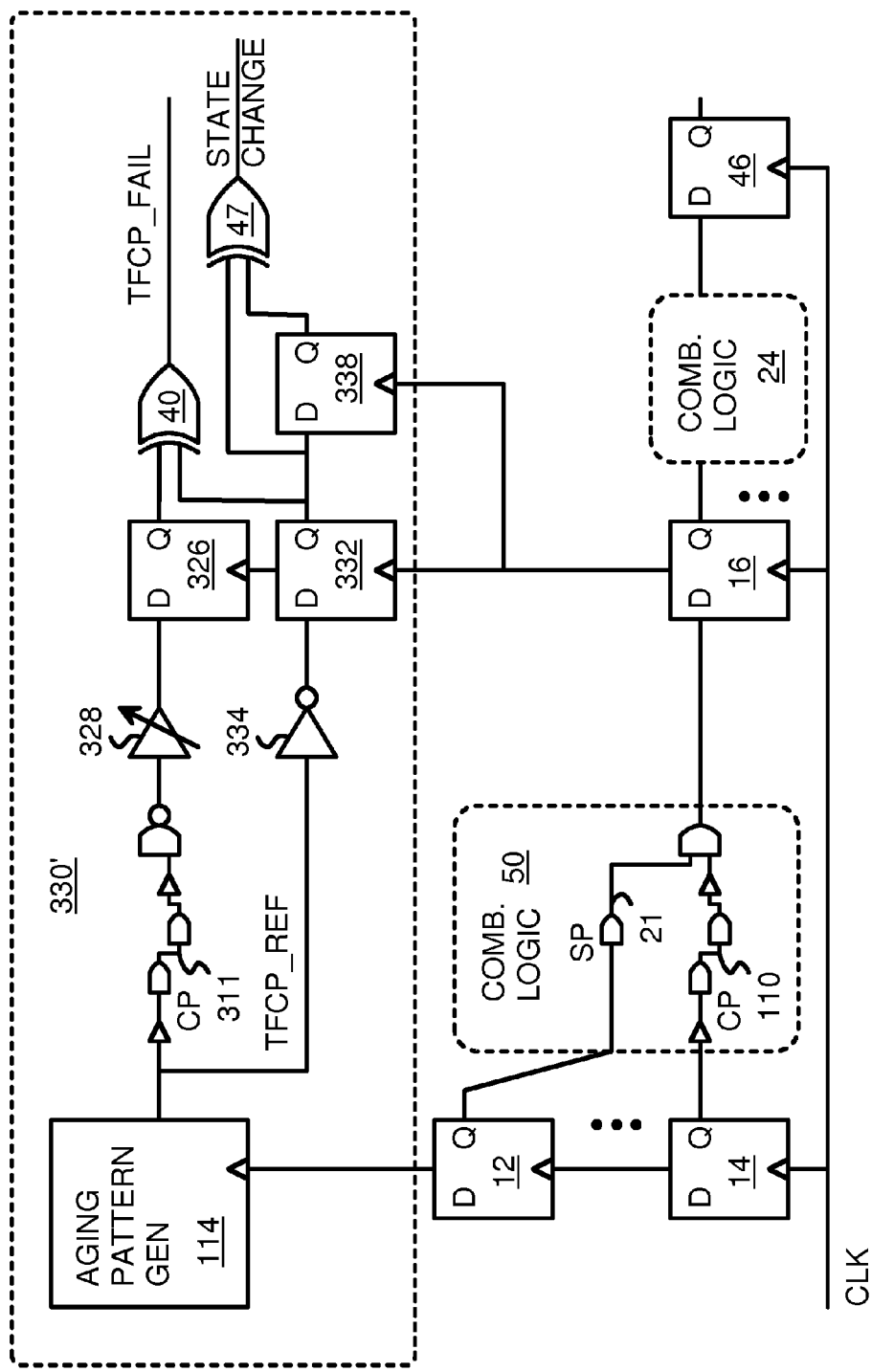
FIG. 7 is a schematic of toggling functional critical paths and their timing sensors that also detect state change.

FIG. 7 is a schematic of toggling functional critical paths and their timing sensors that also detect state change. Aging pattern generator 114 operates on software control to infrequently change state. Such low-frequency patterns may accelerate some kinds of aging failure mechanisms such as NBTI. The output of aging pattern generator 114 is signal TFCP_REF.

Toggling functional critical path 311 is an inverting path, so inverter 334 is added to the reference path to reference flip-flop 332.

A set-up timing failure should only be valid when a state change occurs in reference flip-flop 332. When both the current and next states of reference flip-flop 332 are identical, then an absence of a timing failure signal from aging sensor 330' should be disregarded.

The previous state is sampled from the Q output of reference flip-flop 332 by the D input of previous state flip-flop 338. XOR gate 47 compares the previous state output by previous state flip-flop 338 with the current state of reference flip-flop 332. A high from XOR gate 47 indicates a state change. Margin delay adjustment controller 430 (FIG. 5) can disregard TFCP_FAIL from capture margin detect flip-flop 326 when STATE_CHANGE from XOR gate 47 is low, indicating that no valid state change occurred.

Figure 8:
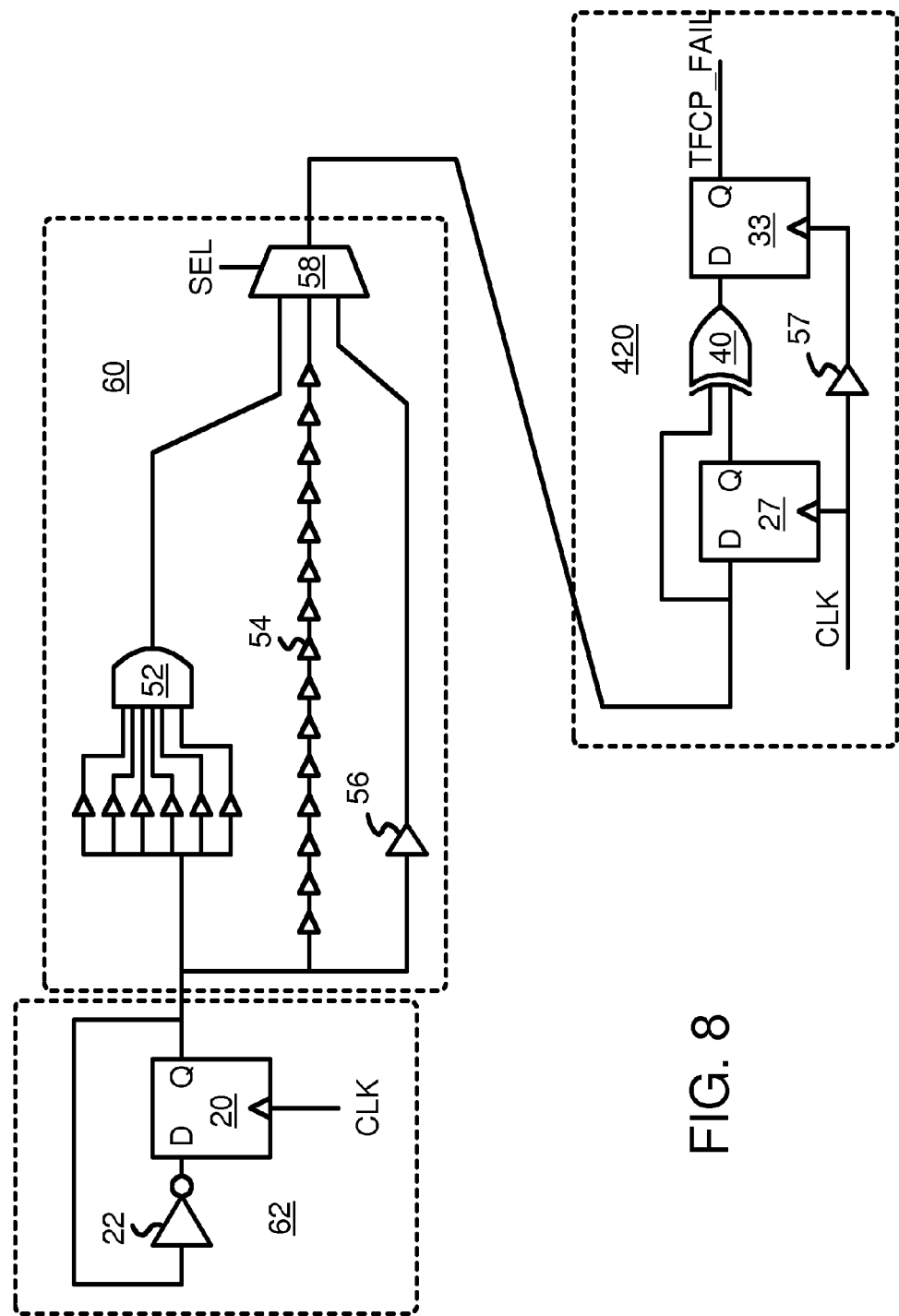
FIG. 8 shows a representational toggling functional critical path.

FIG. 8 shows a representational toggling functional critical path. Toggling functional critical path 310 (FIG. 6) may be an exact replica of the logic of a functional critical path, such as functional critical path 110. The fanout, gate sizes and combinations, wire lengths, loading, and even orientation and location can be matched as closely as possible.

Toggling functional critical path 310 may also be a representational path that represents the expected worst-case loading, fanout, and delays. In FIG. 8, aging pattern generator 114 is implemented as toggling flip-flop 62 with inverter 22 that inverts the Q output of flip-flop 20 to drive its D input. The Q output of flip-flop 20 drives representational toggling functional critical path 60. Representational toggling functional critical path 60 has a high fanout to many buffers to the many inputs of AND gate 52, which drives one input of mux 58. Another input of mux 58 is driven by a long string of delay inverters 54, while a third input of mux 58 is driven by large buffer 56. All three paths are driven by toggling flip-flop 62. Software or margin delay adjustment controller 430 can select one of the three paths for testing through the select SEL input of mux 58.

The output of mux 58 is clocked into detect flip-flop 27. When the delay through the path selected by mux 58 is too slow to meet the set-up time, the wrong data is clocked into detect flip-flop 27, and XOR gate 40 detects that the D and Q terminals of detect flip-flop 27 differ. A high is clocked into failure flip-flop 33 to cause toggling functional critical path timing sensor 420 to signal TFCP_FAIL to margin delay adjustment controller 430. Buffer 57 delays CLK to failure flip-flop 33.

Figure 9:
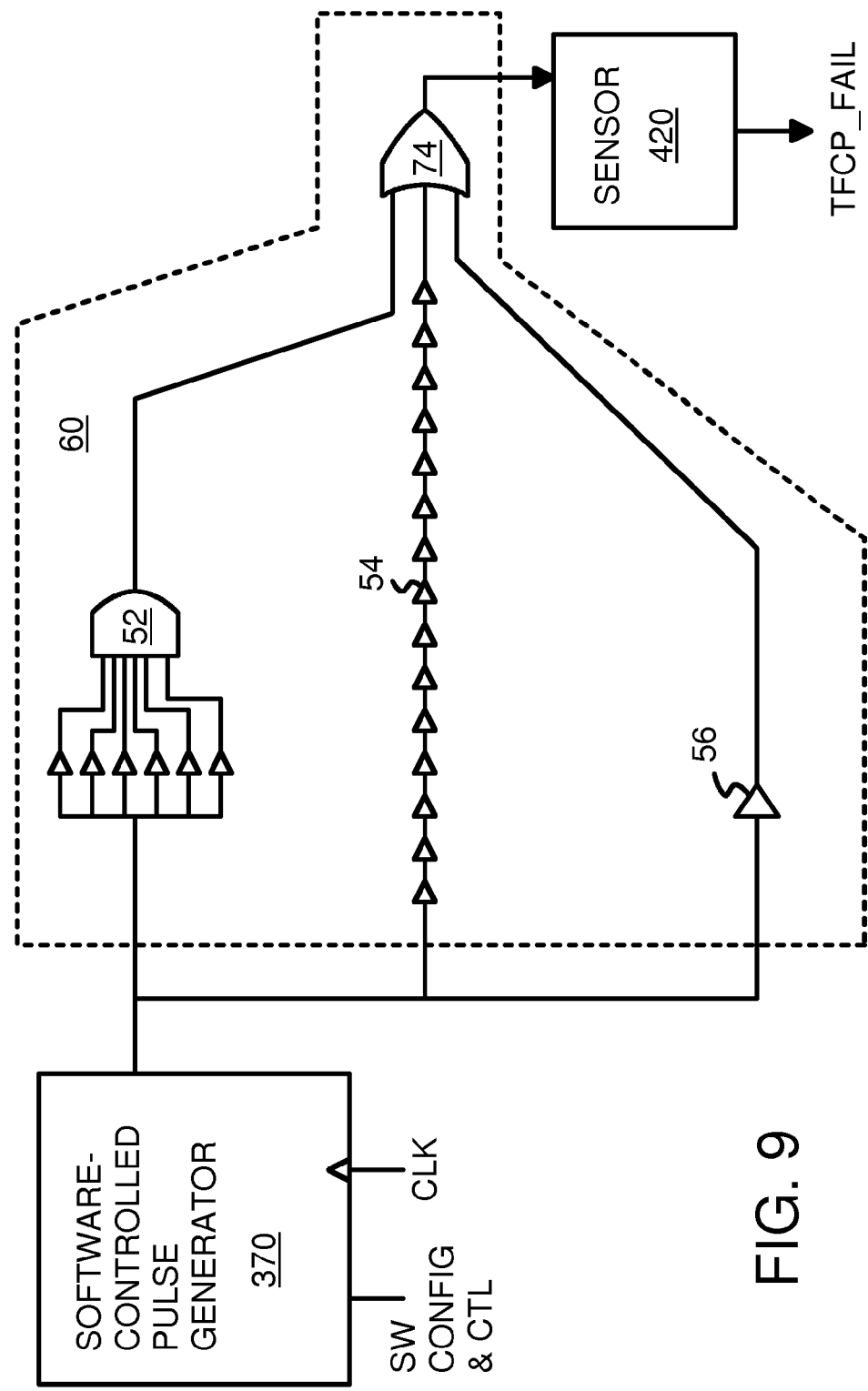
FIG. 9 shows another representational toggling functional critical path.

FIG. 9 shows another representational toggling functional critical path. Aging pattern generator 114 is implemented as software-controlled pulse generator 370, which generates pulses under software control. Software can program software-controlled pulse generator 370 to generate a pattern with frequent transitions, or with infrequent transitions, with either high or low off states.

The three paths in representational toggling functional critical path 60 are logically combined by OR gate 74 to drive toggling functional critical path timing sensor 420.

Figure 10A:
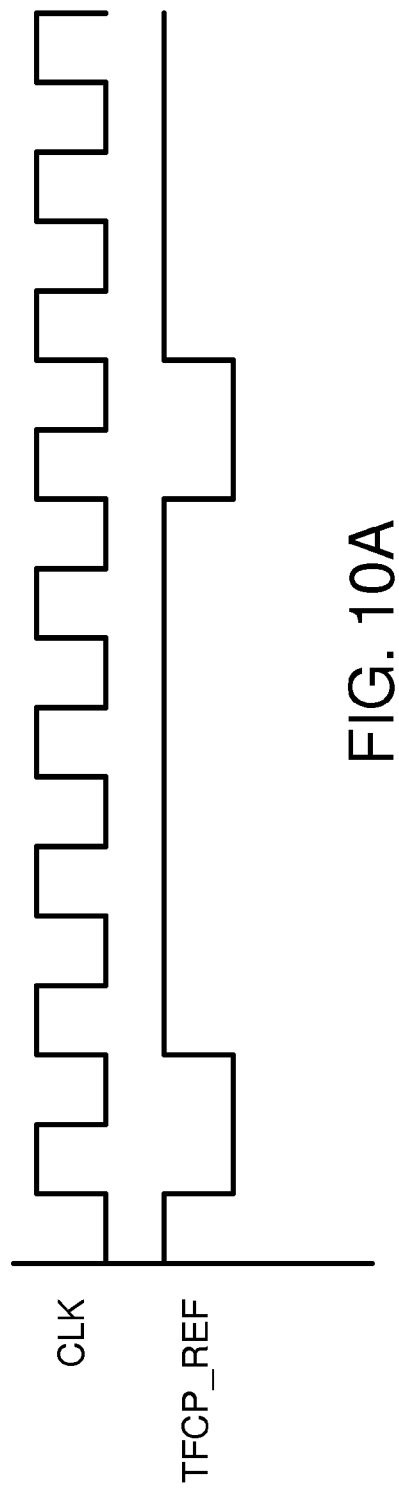
FIGS. 10A-B are timing diagrams showing low-transition-density aging test patterns.
Figure 10B:
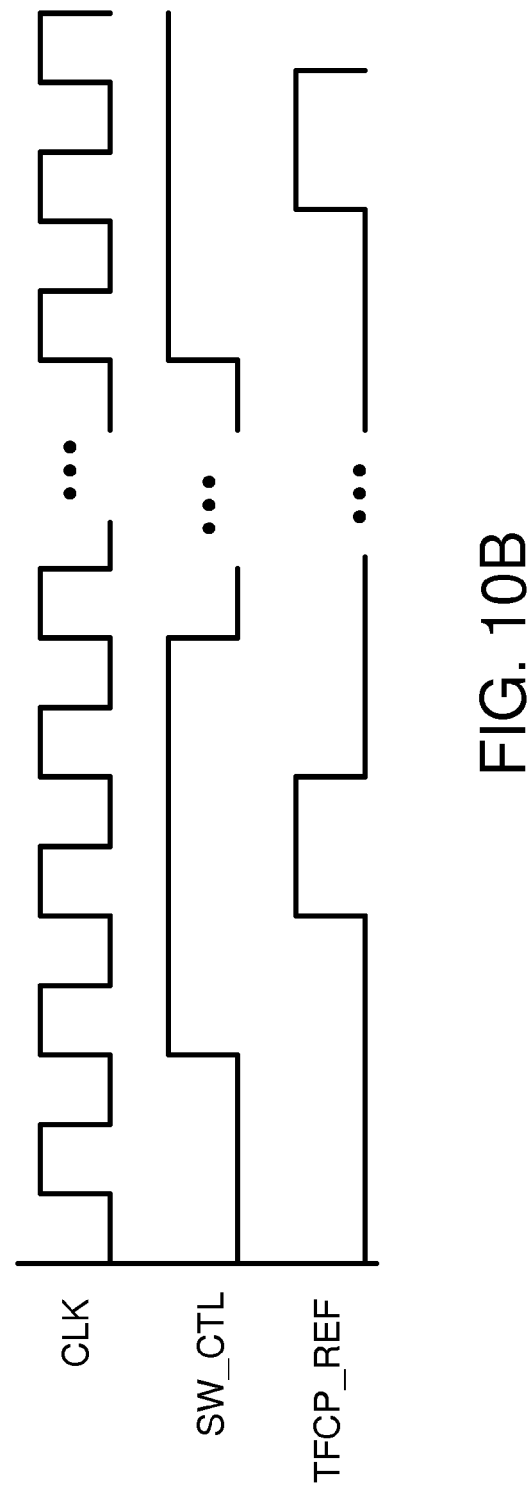

FIGS. 10A-B are timing diagrams showing low-transition-density aging test patterns. In FIG. 10A, software-controlled pulse generator 370 (FIG. 9) is programmed to pulse low every fifth cycle of CLK. In FIG. 10B, software causes software-controlled pulse generator 370 to generate only one pulse each time software accesses software-controlled pulse generator 370 by asserting SW_CTL high for a few CLK cycles. TFCP_REF, the output of aging pattern generator 114 applied to the inputs of toggling functional critical paths 310, . . . 312, remains low when not pulsed by software. There may be a thousand or more CLK cycles between pulses in FIG. 10B.

The very low transition density of FIG. 10B may be useful in accelerating wear due to NTBI or other mechanisms where transistors are left in the on state or off for a very long time. The high current through a transistor channel may cause localized channel heating that may cause certain kinds of wear. Such localized heating may not occur when transitions are frequent and transistors are switched off, allowing them to cool.

Figure 11:
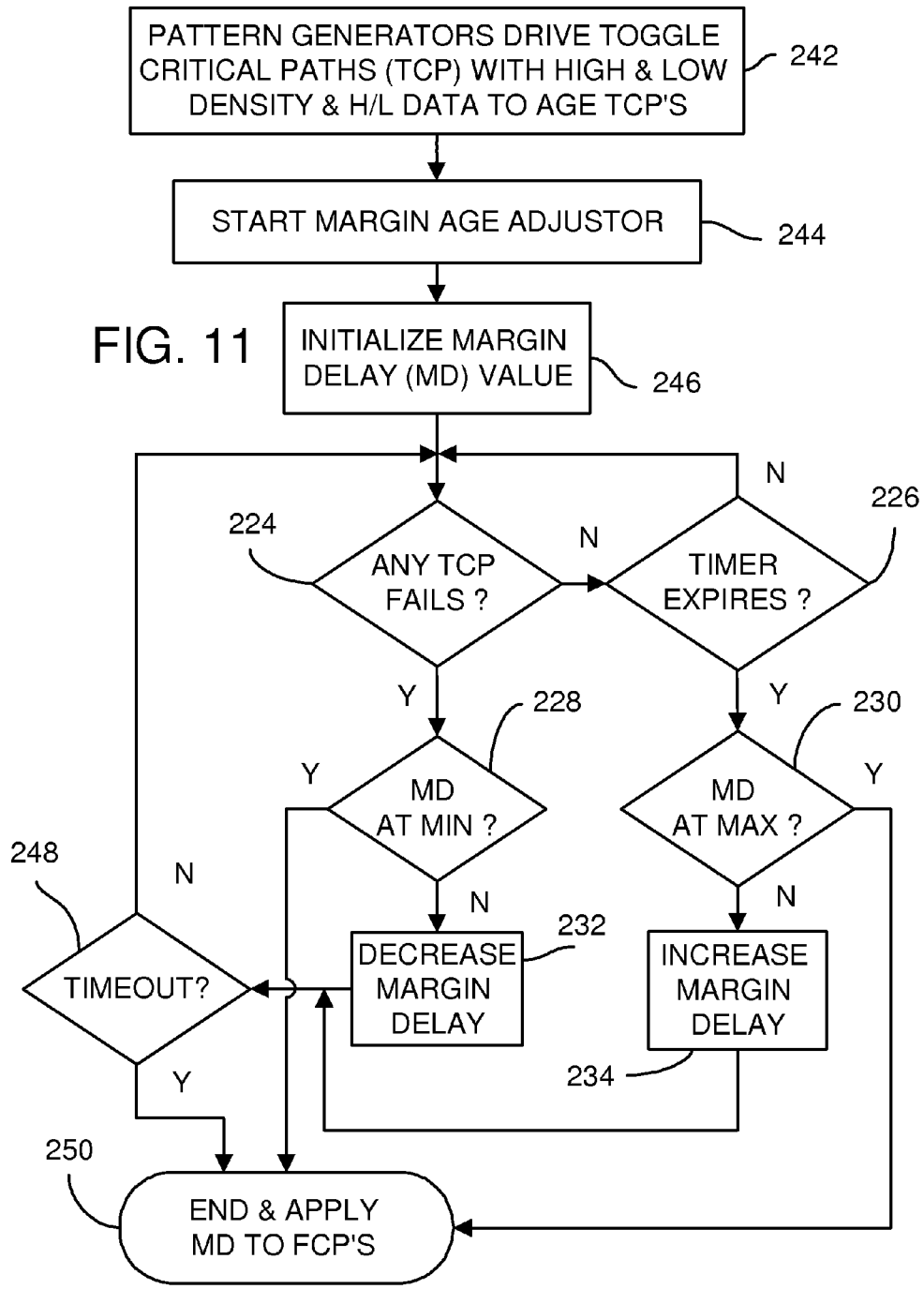
FIG. 11 is a flowchart of operation of the margin delay adjustment controller of FIG. 5.

FIG. 11 is a flowchart of operation of margin delay adjustment controller 430. Aging pattern generator 114 is activated to generate various aging test patterns, such as high-density toggling, low-density infrequent pulses with high or low states between pulses, step 242. These patterns can operate continuously when the chip is powered on for the entire lifetime of the chip. Over the years as hot carriers inject charge into gate oxides and interface layers, transistor threshold voltages increase and delays increase.

Periodically, such as once per calendar month, or after a predetermined number of hours of operation, or at each startup, or some other trigger, margin delay adjustment controller 430 is activated, step 244 to measure delays in toggling functional critical paths 310, . . . 312. An initial value for the margin delay to margin delay buffer 328 is selected, step 246. This initial margin delay value may be the current value being applied by margin delay adjustment controller 430 to functional critical path timing sensors 120, . . . 122. Alternately, the initial margin delay value may be a midpoint value or an endpoint of a range.

As aging pattern generator 114 continues to apply aging test patterns to toggling functional critical paths 310, . . . 312, margin delay adjustment controller 430 checks the TFCP_FAIL signals from toggling functional critical path timing sensors 420, . . . 422. When no failures occur, step 224, and the timer expires, step 226, the margin delay can be increased, step 234, if not already at its maximum, step 230.

When the margin delay is adjusted by margin delay adjustment controller 430 during the process of FIG. 11, the margin delays to margin delay buffer 328 in Aging sensor 330 (FIG. 6) or toggling functional critical path timing sensors 420, . . . 422 (FIG. 5) is adjusted, adding or reducing the path delays. The margin delays to margin delay buffer 28 in functional critical path timing sensors 120, . . . 122 are not yet adjusted until the process of FIG. 11 is completed.

When margin delay adjustment controller 430 detects a TFCP_FAIL signal from toggling functional critical path timing sensors 420, . . . 422, step 224, the margin delay should be decreased, step 232, if not already at its minimum, step 228.

The process of increasing or decreasing margin delays continues until the process times out, step 248, or until the maximum or minimum margin delay is reached, steps 232, 234. Then the process ends and the final margin delay can be applied to margin delay buffers 28 in functional critical path timing sensors 120, step 250.

The final margin delay value can be adjusted before being sent to functional critical path timing sensors 120, such as by increasing the margin delays by an additional amount to provide extra guardband.

ALTERNATE EMBODIMENTS

Several other embodiments are contemplated by the inventors. For example many kinds and arrangements of logic gates and logic structures are possible, including NAND, NOR, AND, OR, XOR, NXOR, etc. Many toggling functional critical paths 310, . . . 312 may be used, each with different applied test patterns from aging pattern generator 114. Some paths could be toggled frequently while other paths are toggled very rarely, some remaining in a high state and other paths remaining in a low state between pulses. The toggling functional critical paths 310, . . . 312 may differ in logic, and some may be copies of actual functional critical paths, such as functional critical path 110, while other toggling functional critical paths 310, . . . 312 may be representational, such as shown in FIGS. 8-9, with many variations in logic arrangements and loading possible.

The aging test patterns from aging pattern generator 114 could remain on even when the chip is suspended or put into a low-power state, or could be turned off. A pulse could be generated by software or firmware writing to a register, or the software could be externally executed, where external software asserts a pin to the chip to activate a pulse. One pulse could occur every 5, 10, 50, 100, 1024, 1M, or other number of clock cycles.

While a rising edge CLK has been described, flip-flops that use the falling edge of CLK or of another clock may be used. Multiple clocks may be used. While XOR gates have been shown, exclusive-NOR (XNOR) gates could be substituted with inverted output signals.

The change-of-state signal generated by XOR gate 47 could be AND'ed with the timing failure signal from XOR gate 40 and the AND result latched into a flip-flop that generates a validated TFCP_FAIL signal. An AND gate combining the outputs of XOR gates 40, 47 could drive the D-input of an accumulator.

A chip could have several voltage islands or domains. One domain could be powered with one VDD voltage, while another domain could be powered with a different VDD voltage. Separate voltage domains could be used for memory arrays, logic, processors, analog circuits, and I/O. Each voltage domain could have its own functional critical paths, sensors, and VDD controller.

In FIG. 4B, a timing hazard occurs since the data clocked into the next-stage flip-flop is not guaranteed to be correct. The flip-flop could become meta-stable or unstable if the D input was at an intermediate voltage level rather than high or low, and this instability could resolve itself at some unknown time in the future. Having only one critical path sensor could be dangerous if such instability were to occur. However, having several critical paths that are sensed at the same time can reduce this danger, since each critical path has a slightly different delay.

A LSSD scan chain may include all of first-level flip-flops 12, 24, next-level flip-flop 16, and third-level flip-flop 46 (FIG. 3, etc.). The levels are arbitrary since logic signals can wrap backwards among any of the flip-flops. Combinatorial logic 50 and combinatorial logic 24 may be part of the same logic block and are shown separately as a teaching aid rather than as a real circuit division. While flip-flops 12, 14, 16, 46 have been shown using the same clock CLK, latches could be substituted. CLK could be replaced by two-phase non-overlapping clocks, with combinatorial logic between each phase latch. Registers that store state could be designed in RTL and implemented as D-type flip-flops, testable or scan-chain D-type flip-flops, muxed-input or flip-flops with a second test clock, toggle flip-flops, J-K flip-flops, transparent latches, S-R latches, and various combinations.

While measuring the delay of functional critical path 110 has been described as occurring during a test mode when functional data is paused, timing delays could also be measured during normal operation when the test mode is not active. This is especially true when margin delay buffer 28 is present, since early capture flip-flop 26 in the timing sensor will fail before next-level flip-flop 16 in the functional data path. Test mode may be necessary to ensure that state transitions occur since normal functional data may not toggle next-level flip-flop 16 for long periods of time, depending on the functions being performed. Having many functional critical paths 110, 111, . . . 112 can improve controller 130 accuracy since more paths are checked for timing. Likewise, having many toggling functional critical paths 310, . . . 312 can improve accuracy of margin delay adjustment controller 430.

Other kinds of flip-flops, accumulators, S-R latches, or flag registers may be substituted. In particular, a multi-bit accumulator could be added that counts a number of validated timing failures that have occurred since the accumulator was last cleared. Controller 130 may use the count value to determine how large of a change to make to VDD and controller 430 could use the count value to determine how much to change the margin delay. Many variations and different types of timing sensors could be substituted, such as edge-triggered, sensors with or without margin delays, sensors with delays capture clocks, etc.

The delay generated by margin delay buffer 28 may be partially variable. A metal mask option may be used to set part of these delays, or the delay may be set during design after careful statistical or other analysis. These delays may have both a fixed delay component and a programmable delay component. The programmable delays may be controlled by controller 130. Controller 130 may sweep these delays across a range of increments. Controller 130 may adjust the margin delay, VDD, and the clock frequency using a closed control loop. A Delay-Locked Loop (DLL) may be used, muxes or switches to bypass a variable number of delay buffers, to add capacitance or resistance delays, or other programmable methods to allow the controller to set margin delays or other delays. The increment for the delay adjustment may be larger than the corresponding VDD increment. Controller 130 may use VDD adjustment as a finer control and margin delay adjustment as a coarse control. Ideally, the margin delay is large enough to accommodate any expected jumps in VDD due to adjustments to IVR 136 or PMIC 138.

When VDD is set too high, transistor speed may be so high that the delay through margin delay buffer 28 may be too small to distinguish between next-level flip-flop 16 and early capture flip-flop 26.

The controller could use an initial nominal VDD value and then increase VDD when no failures are detected for several cycles. VDD may be decreased when a failure occurs for a valid state change. Once a maximum or minimum VDD is reached, no further VDD changes are allowed. In some embodiments, the clock frequency then might be changed, such as by adjusting a Phase-Locked Loop (PLL) of other clock generator. VDD could be increased by larger increments than by the decrement increment, and the size of the increment could be a function of the number of timing failures detected.

Controllers may account for changes in temperature, aging or wear of the circuit, voltage drops, or other phenomena. Whatever causes speed changes in the circuit is accounted for by measuring the actual timing delays of functional critical paths compared with set-up timing requirements to flip-flops, either with or without added timing margin.

Rather than use internal controllers 130, 430, external software or an external tester could read the results from the critical path timing sensors, such as by reading TSU_FAIL or TFCP_FAIL signals stored in an on-chip register. The external software or tester could then write a new value for VDD to VDD register 132 to adjust VDD (FIG. 3), or similarly adjust margin delays. Other combinations of internal and external control are possible.

Extra components could be added to the short paths during design synthesis to increase the width of the timing window, making the sensor design more robust. A transparent latch that prevents the short path's output form changing during the first half of the clock period could be added. This latch would increase TSP to half of a clock period. Extra components could be added to functional critical path 110 or to toggling functional critical paths 310, . . . 312 to increase delay for extra margin. There are limits to VDD variation, so controller 130 may adjust VDD within these limits.

Software, firmware, hardware, and various combinations may be used for sorting and selecting critical paths and for controllers 130, 430 and other components.

Some embodiments may not use all components. For example, registers, gates, switches, etc. may be added or deleted in some embodiments. Inversions may be added by swapping inverting and non-inverting inputs as desired, but do not change the overall function and thus may be considered equivalents. Clocks may be inverted. Active-low clocks could be used that have non-overlapping low-going pulses rather than non-overlapping high-going pulses.

Capacitors, resistors, and other filter elements may be added. Gates could employ n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, extra buffering, etc., and parasitic components may also be present. Enabling and disabling the circuit could be accomplished with additional transistors or in other ways. Pass-gate transistors or transmission gates could be added for isolation.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A wear-sensing integrated circuit comprising:
   an aging pattern generator that generates a plurality of patterns to accelerate wear of transistors;
   a plurality of toggling functional critical paths that receive patterns generated by the aging pattern generator;
   a plurality of toggling functional critical path timing sensors, each receiving an output of a toggling functional critical path in the plurality of toggling functional critical paths;
   a plurality of fail signals generated by the plurality of toggling functional critical path timing sensors, wherein a fail signal is generated when a delay through a toggling functional critical path exceeds a timing requirement; and
   a margin delay adjustment controller that receives the fail signals generated by the plurality of toggling functional critical path timing sensors, the margin delay adjustment controller adjusting a margin value in response to receiving the fail signals;
   wherein the margin value increases over time as the wear-sensing integrated circuit ages during a lifetime of the wear-sensing integrated circuit.

2. The wear-sensing integrated circuit of claim 1 wherein the timing requirement is a set-up time to a clocked register plus a margin delay of a margin delay buffer;
   wherein the fail signals are generated when delays through the toggling functional critical path plus the margin delay fails to meet the set-up time to the clocked register.

3. The wear-sensing integrated circuit of claim 2 wherein the toggling functional critical path timing sensor comprises:
   a margin delay buffer that receives an output of a toggling functional critical path;
   a first register that receives an output of the margin delay buffer;
   a second register that receives an input of the toggling functional critical path; and
   a compare gate that compares an output of the first register to an output of the second register to generate the fail signal when the output of the first register does not match the output of the second register.

4. The wear-sensing integrated circuit of claim 3 wherein a margin delay through the margin delay buffer is variable;
   wherein the margin delay adjustment controller sweeps the margin delay across a range of values to test for timing failures to determine the margin value.

5. The wear-sensing integrated circuit of claim 4 wherein the aging pattern generator generates the plurality of patterns to accelerate wear of transistors in the plurality of toggling functional critical paths, wherein the patterns comprise:
   a toggling pattern that toggles a first input to a first toggling functional critical path in the plurality of toggling functional critical paths, wherein the first toggling functional critical path has accelerated wear due to Hot Carrier Injection (HCI) effects.

6. The wear-sensing integrated circuit of claim 5 wherein the aging pattern generator generates the plurality of patterns to accelerate wear of transistors in the plurality of toggling functional critical paths, wherein the patterns further comprise:
   a low-level low-density pattern that is applied to a second input to a second toggling functional critical path in the plurality of toggling functional critical paths, wherein the second toggling functional critical path has accelerated wear due to Negative Bias Temperature Instability (NBTI) effects;
   wherein the aging pattern generator generates the low-level low-density pattern with a duty cycle of less than 10%, wherein no more than one high pulse is generated for every X clock periods, wherein X is at least 10, wherein the second input remains in a low state for X−1 clock periods; and
   a high-level low-density pattern that is applied to a third input to a third toggling functional critical path in the plurality of toggling functional critical paths, wherein the third toggling functional critical path has accelerated wear due to Negative Bias Temperature Instability (NBTI) effects;
   wherein the aging pattern generator generates the high-level low-density pattern with a duty cycle of more than 90%, wherein no more than one low pulse is generated for every X clock periods, wherein X is at least 10, wherein the third input remains in a high state for X−1 clock periods.

7. The wear-sensing integrated circuit of claim 5 wherein the toggling functional critical paths comprise copies of functional critical paths that carry user data or control information during a normal operating mode of the wear-sensing integrated circuit.

8. The wear-sensing integrated circuit of claim 5 wherein the toggling functional critical paths comprise representational critical paths having a string of gates with a number of gates exceeding a maximum number of gates in any functional critical path in the wear-sensing integrated circuit, or a gate with a fan-out exceeding a maximum fan-out of any functional critical path in the wear-sensing integrated circuit.

9. The wear-sensing integrated circuit of claim 5 further comprising:
   a plurality of registers for storing internal signals in response to a clock;
   combinatorial logic between inputs and outputs of the plurality of registers;
   a plurality of functional critical paths being among a top 10% of paths in the combinatorial logic sorted by delay;
   wherein the plurality of functional critical paths carry real data and control information during normal modes of operation rather than being dummy paths having no functional use; and
   a functional critical path timing sensor for each functional critical path in the plurality of functional critical paths, each functional critical path driving a next-level input to a next-level register in the plurality of registers, wherein the functional critical path timing sensor generates a functional timing failure signal when data passing through a functional critical path arrives at the next-level input after a trigger time;

wherein the trigger time is a margin time plus a set-up time for the next-level input relative to the clock to the next-level register;

wherein the margin value from the margin delay adjustment controller controls the margin time;

wherein the functional timing failure signal is generated by sensing a delay through the functional critical path relative to the trigger time for the next-level register using actual components of the functional critical path under current process, temperature, and voltage conditions with margin times adjusted for measured transistor wear.

10. The wear-sensing integrated circuit of claim 9 further comprising:

a VDD controller that receives the functional timing failure signal from the functional critical path timing sensor, the VDD controller causing a power-supply voltage to the plurality of registers and to the combinatorial logic to be increased when the functional timing failure signal is received, the VDD controller causing the power-supply voltage to be reduced when no functional timing failure signal is received for a period of time, wherein the power-supply voltage is adjusted to compensate for functional timing failures detected through the functional critical paths.

11. The wear-sensing integrated circuit of claim 10 wherein each functional timing sensor comprises:

a margin delay buffer receiving the next-level input and driving a delayed input delayed by the margin time;

an early capture register that is clocked by the clock and generates a delayed output from the delayed input; and a compare gate that compares the delayed output to the delayed input or to an output of the next-level register and activates the functional timing failure signal when the delayed output does not match.

12. A wear-compensating timing adjustor comprising:

an aging pattern generator that generate patterns that accelerate transistor wear;

a plurality of toggling functional critical paths that receive the patterns generated by the aging pattern generator, wherein transistors in the plurality of toggling functional critical paths wear at an accelerated rate;

a plurality of toggling functional critical path timing sensors, each toggling functional critical path timing sensor receiving a delayed output from one of the plurality of toggling functional critical paths that is delayed by a variable delay buffer, each toggling functional critical path timing sensor activating a timing failure signal when the delayed output does not meet a set-up time to a clocked register;

a margin delay adjustment controller that applies different delay values to the variable delay buffer and tests for the timing failure signals to generate a current wear value;

wherein the current wear value indicates an amount of wear and worsens over a lifetime of the wear-compensating timing adjustor;

a plurality of functional critical paths;

a plurality of functional critical path timing sensors, each functional critical path timing sensor receiving a functional delayed output from one of the plurality of functional critical paths that is delayed by a variable functional delay buffer, each functional critical path timing sensor activating a functional timing failure signal when the functional delayed output does not meet a set-up time to a functional clocked register;

wherein a delay of the variable functional delay buffer is adjusted over the lifetime of the wear-compensating timing adjustor by the current wear value; and a power-voltage controller that receives the functional timing failure signals from the plurality of functional critical path timing sensors, the power-voltage controller increasing a power-supply voltage when a functional timing failure signal is received, the power-voltage controller decreasing the power-supply voltage when the functional timing failure signal is not received over a period of time, whereby the power-supply voltage is adjusted in response to timing failures with delays adjusted over the lifetime of the wear-compensating timing adjustor using the current wear value.

13. The wear-compensating timing adjustor of claim 12 wherein the aging pattern generator generates the patterns to accelerate wear of transistors in the plurality of toggling functional critical paths, wherein the patterns comprise:

a toggling pattern that toggles a first input to a first toggling functional critical path in the plurality of toggling functional critical paths, wherein the first toggling functional critical path has accelerated wear due to Hot Carrier Injection (HCI) effects.

14. The wear-compensating timing adjustor of claim 12 wherein the aging pattern generator generates the patterns to accelerate wear of transistors in the plurality of toggling functional critical paths, wherein the patterns further comprise:

a low-level low-density pattern that is applied to a second input to a second toggling functional critical path in the plurality of toggling functional critical paths, wherein the second toggling functional critical path has accelerated wear due to Negative Bias Temperature Instability (NBTI) effects;

wherein the aging pattern generator generates the low-level low-density pattern with a duty cycle of less than 10%, wherein no more than one high pulse is generated for every X clock periods, wherein X is at least 10, wherein the second input remains in a low state for X−1 clock periods; and a high-level low-density pattern that is applied to a third input to a third toggling functional critical path in the plurality of toggling functional critical paths, wherein the third toggling functional critical path has accelerated wear due to Negative Bias Temperature Instability (NBTI) effects;

wherein the aging pattern generator generates the high-level low-density pattern with a duty cycle of more than 90%, wherein no more than one low pulse is generated for every X clock periods, wherein X is at least 10, wherein the third input remains in a high state for X−1 clock periods.

15. The wear-compensating timing adjustor of claim 12 wherein the toggling functional critical paths comprise copies of functional critical paths that carry user data or control information during a normal operating mode of the wear-compensating timing adjustor.

16. The wear-compensating timing adjustor of claim 12 wherein the toggling functional critical paths comprise representational critical paths having a string of gates with a number of gates exceeding a maximum number of gates in any functional critical path in an integrated circuit, or a gate with a fan-out exceeding a maximum fan-out of any functional critical path in the integrated circuit.

17. The wear-compensating timing adjustor of claim 12 wherein each toggling functional critical path timing sensor comprises:
- a reference register that clocks in an input to a toggling functional critical path;
- a clocked register that clocks in the delayed output; and
- a compare gate that compares an output of the reference register to an output of the clocked register to generate the timing failure signal.

18. A wear-compensating chip comprising:
- aging pattern generator means for generating patterns that accelerate wear of transistors;
- a plurality of toggling functional critical paths that receive the patterns generated by the aging pattern generator means, wherein transistors in the plurality of toggling functional critical paths wear at an accelerated rate;
- a plurality of toggling functional critical path timing sensors means, each toggling functional critical path timing sensor means for activating a timing failure signal when a delayed output does not meet a set-up time to a clocked register, wherein the delayed output is received from one of the plurality of toggling functional critical paths and is delayed by a variable delay; and
- margin delay adjustment controller means for generating different delay values for the variable delay, and for testing for the timing failure signals to generate a current wear value;
- wherein the current wear value indicates an amount of wear, and worsens over a lifetime of the wear-compensating chip.

19. The wear-compensating chip of claim 18 wherein the margin delay adjustment controller means is for periodically adjusting the current wear value by:
- setting a current delay value for the variable delay to an initial value;
- when a timer expires and no timing failure signals are received, increasing the current delay value for the variable delay;
- when a timing failure signal is received, decreasing the current delay value for the variable delay;
- when the current delay value reaches a limit, or when a routine end is reached, using the current delay value to set the current wear value.

20. The wear-compensating chip of claim 19 further comprising:
- a plurality of functional critical paths;
- wherein the plurality of functional critical paths carry real data and control information during a normal mode of operation;
- a plurality of margin buffer means for delaying an output of a functional critical path in the plurality of critical paths by a variable functional delay;
- wherein the margin delay adjustment controller means is further for adjusting the variable functional delay in response to the current wear value;
- a plurality of early capture register means for storing a captured state in response to a clock and an output of a margin buffer means;
- critical path timing sensor means, coupled to each functional critical path in the plurality of functional critical paths, for activating a functional timing failure signal when a set-up timing of an early capture register means for a functional critical path is violated; and
- power-voltage controller means, receiving the functional timing failure signal from the functional critical path timing sensor means, for causing a power-supply voltage to be increased when the functional timing failure signal is received, and for causing the power-supply voltage to be reduced when no functional timing failure signal is received for a period of time,
- wherein the power-supply voltage is adjusted to compensate for functional timing failures detected through the functional critical paths.

* * * * *